United States Patent
Shi et al.

(10) Patent No.: US 9,660,000 B2
(45) Date of Patent: May 23, 2017

(54) ORGANIC LIGHT EMITTING DIODE (OLED) ARRAY SUBSTRATE AND FABRICATING METHOD THEREOF, DISPLAY DEVICE

(71) Applicant: BOE TECHNOLOGY GROUP CO., LTD., Beijing (CN)

(72) Inventors: Shiming Shi, Beijing (CN); Jing Gao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/894,913

(22) PCT Filed: Jul. 9, 2015

(86) PCT No.: PCT/CN2015/083642
§ 371 (c)(1),
(2) Date: Nov. 30, 2015

(87) PCT Pub. No.: WO2016/127560
PCT Pub. Date: Aug. 18, 2016

(65) Prior Publication Data
US 2016/0358983 A1 Dec. 8, 2016

(30) Foreign Application Priority Data
Feb. 12, 2015 (CN) .......................... 2015 1 0076801

(51) Int. Cl.
*H01L 27/32* (2006.01)
*H01L 27/12* (2006.01)
(Continued)

(52) U.S. Cl.
CPC .......... *H01L 27/3216* (2013.01); *H01L 27/12* (2013.01); *H01L 27/3209* (2013.01);
(Continued)

(58) Field of Classification Search
CPC ............. H01L 27/3216; H01L 27/3209; H01L 27/3218; H01L 27/3248; H01L 51/5203; H01L 51/56
See application file for complete search history.

(56) References Cited

U.S. PATENT DOCUMENTS

2007/0046195 A1 3/2007 Chin et al.
2012/0176025 A1 7/2012 Lee et al.
(Continued)

FOREIGN PATENT DOCUMENTS

CN 101083275 A 12/2007
CN 103050630 A 4/2013
(Continued)

OTHER PUBLICATIONS

International Search Report and Written Opinion with English Language Translation, dated Sep. 28, 2015, Application No. PCT/CN2015/083642.
(Continued)

*Primary Examiner* — Karen Kusumakar
(74) *Attorney, Agent, or Firm* — Blakely Sokoloff Taylor & Zafman LLP

(57) ABSTRACT

An OLED array substrate, comprising a plurality of pixel units, the pixel unit at least comprising a first sub-pixel, a second sub-pixel and a third sub-pixel, further comprising: a substrate, a TFT array and a pixel electrode formed on the substrate, and at least two organic luminescent material layers that display different colors formed on the pixel electrode, wherein the first sub-pixel comprises a first pixel electrode, the second sub-pixel comprises a second pixel electrode, the third sub-pixel comprises a third pixel electrode, an organic luminescent material layer of a first color covers the adjacent first pixel electrode and second pixel electrode in the pixel unit, an organic luminescent material
(Continued)

layer of a second color covers the adjacent second pixel electrode and third pixel electrode in the pixel unit.

14 Claims, 3 Drawing Sheets

(51) Int. Cl.
    *H01L 51/52*           (2006.01)
    *H01L 51/56*           (2006.01)

(52) U.S. Cl.
    CPC ...... *H01L 27/3218* (2013.01); *H01L 27/3248* (2013.01); *H01L 51/5203* (2013.01); *H01L 51/56* (2013.01)

(56) References Cited

U.S. PATENT DOCUMENTS

2013/0140533 A1*   6/2013   Lee ................... H01L 51/5265
                                                           257/40
2014/0183471 A1    7/2014   Heo

FOREIGN PATENT DOCUMENTS

| CN | 103943658 A | 7/2014 |
|----|-------------|--------|
| CN | 104659037   | 5/2015 |

OTHER PUBLICATIONS

Office Action in Chinese Application No. 201510076801.0 dated Mar. 9, 2017, with English translation. 8 pages.

* cited by examiner

- - Prior Art - -

- - Prior Art - -

ORGANIC LIGHT EMITTING DIODE (OLED) ARRAY SUBSTRATE AND FABRICATING METHOD THEREOF, DISPLAY DEVICE

FIELD OF THE DISCLOSURE

The present disclosure relates to the field of display technology, particularly to an OLED array substrate and fabricating method thereof, and a display device.

BACKGROUND OF THE DISCLOSURE

The OLED (Organic Light-Emitting Diode) display has been widely applied in the filed of display technology. The basic structure of the OLED display comprises an anode, a luminescent layer and a cathode, wherein the luminescent layer is formed using the organic electroluminescent material.

The OLED generally realize color display by two ways: one is using a white organic light emitting material combined with a color filter to realize color display. Since part of the light is absorbed by the color filter, the display luminance is reduced by using such a method to realize color display.

The other is using a high fine metal mask plate (FMM) to plate the organic light emitting materials of different primary colors to form respective pixels. Whereas the area of the pixel formed by evaporating of the metal mask plate is related to the display resolution, the higher the resolution is, the density of the pixel is larger, the area of the pixel is smaller. Take the display screen of 5 inch full high definition (FHD) as an example, the display resolution is 1080×1920, then the pixel density on the substrate is approximately 440 PPI, for sub-pixels including three colors of red, green and blue, each sub-pixel is about 19.22 um×57.65 um.

However, in consideration of the factor that the luminous efficiency of blue is low generally, the area of the blue sub-pixel will be increased in a pixel, the areas of the red and green sub-pixels will be reduced. Limited by the FMM evaporating process, in the case that the area of the blue sub-pixel is larger than the area of the red and the green sub-pixels, the process difficulty of reducing the area of the red and the green sub-pixels further through the FMM process is significantly great, the cost is also very high, thus it would be impossible to reduce the area of the sub-pixel and increase the display resolution through the FMM evaporating process.

SUMMARY OF THE DISCLOSURE

The embodiments of the present disclosure provide an OLED array substrate and a fabricating method thereof, a display device, which solves the problem of a low resolution of the display device brought by color display that is realized by evaporating organic light emitting materials of different primary colors using a metal mask plate.

In order to achieve the above purpose, the embodiments of the present disclosure adopt the following technical solutions:

In one aspect, the embodiment of the present disclosure provides an OLED array substrate, comprising a plurality of pixel units, the pixel unit at least comprising a first sub-pixel, a second sub-pixel and a third sub-pixel, further comprising: a substrate, a pixel electrode formed on the substrate, at least two organic luminescent material layers that display different colors formed on the pixel electrode, wherein the first sub-pixel comprises a first pixel electrode, the second sub-pixel comprises a second pixel electrode, and the third sub-pixel comprises a third pixel electrode, an organic luminescent material layer of a first color covers the adjacent first pixel electrode and second pixel electrode in the pixel unit, an organic luminescent material layer of a second color covers the adjacent second pixel electrode and third pixel electrode in the pixel unit.

In another aspect, the embodiment of the present disclosure provides a fabricating method of an organic light emitting diode array substrate, the array substrate comprising a plurality of pixel units, the pixel unit at least comprising a first sub-pixel, a second sub-pixel and a third sub-pixel, the fabricating method comprises:

forming a pixel electrode on a substrate, wherein the first sub-pixel comprises a first pixel electrode, the second sub-pixel comprises a second pixel electrode and the third sub-pixel comprises a third pixel electrode;

forming an organic luminescent material layer of a first color, wherein the organic luminescent material layer of the first color covers the adjacent first pixel electrode and second pixel electrode;

forming an organic luminescent material layer of a second color, wherein the organic luminescent material layer of the second color covers the adjacent second pixel electrode and third pixel electrode.

In a further aspect, the embodiment of the present disclosure provides a display device comprising an OLED array substrate provided by any of the embodiments of the present disclosure.

The embodiments of the present disclosure provide an OLED array substrate and fabricating method thereof, and a display device, wherein the array substrate comprises a plurality of pixel units, the pixel unit at least comprising a first sub-pixel, a second sub-pixel and a third sub-pixel, the first sub-pixel comprises a first pixel electrode, the second sub-pixel comprises a second pixel electrode, and the third sub-pixel comprises a third pixel electrode, an organic luminescent material layer of a first color covers the adjacent first pixel electrode and second pixel electrode in the pixel unit, an organic luminescent material layer of a second color covers the adjacent second pixel electrode and third pixel electrode in the pixel unit. That is, the first pixel electrode is only covered with the organic luminescent material layer of the first color, the third pixel electrode is only covered with the organic luminescent material layer of the second color, while the second pixel electrode is covered with the organic luminescent material layer of the first color and the organic luminescent material layer of the second color. Thus, the color displayed by the second sub-pixel is a mixed color of the first color and the second color. Since the organic luminescent material layer of the first color and the organic luminescent material layer of the second color both cover two adjacent pixel electrodes, when the organic luminescent material layer of the first color and the organic luminescent material layer of the second color are deposited through the FMM evaporating process, the organic luminescent material layers cover two pixel electrodes correspondingly, the area of the hollowed area on the mask plate is relatively large, hence, a display panel of a high resolution can be fabricated by reducing the area of the pixel electrode, i.e., reducing the area of a sub-pixel.

BRIEF DESCRIPTION OF THE DRAWINGS

In order to explain the technical solution in the embodiments of the present disclosure or the prior art more clearly, the drawings to be used in the description of the embodiments or the prior art will be introduced briefly next, apparently, the drawings described below are only some embodiments of the present disclosure, for the ordinary skilled person in the art, other drawings can also be obtained based on these drawings in the premise of not paying any creative work.

REFERENCE SIGNS

10—pixel unit; 11—glass substrate; 12—TFT array; 13—pixel electrode; 131—first pixel electrode; 132—second pixel electrode; 133—third pixel electrode; 134—fourth pixel electrode; 14—organic luminescent material layer; 141—red organic luminescent material layer; 142—green organic luminescent material layer; 143—blue organic luminescent material layer.

DETAILED DESCRIPTION OF THE DISCLOSURE

Next, the technical solutions in the embodiments of the present disclosure will be described clearly and completely in combination with the drawings in the embodiments of the present disclosure, apparently, the embodiments described are only a part rather than all of the embodiments of the present disclosure. Based on the embodiments in the present disclosure, all of the other embodiments obtained by the ordinary skilled person in the art on the premise of not paying any creative work belong to the protection scope of the present disclosure.

In order to understand the technical solutions provided in the embodiments of the present disclosure more easily, it is preferred to explain the structure of the existing OLED array substrate in combination with the drawings.

Figure 1:
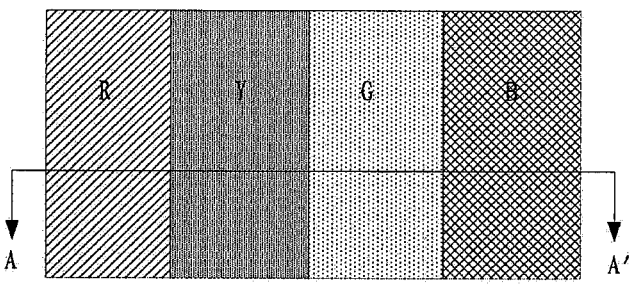
FIG. 1 is a schematic view of an existing pixel unit.
Figure 2:
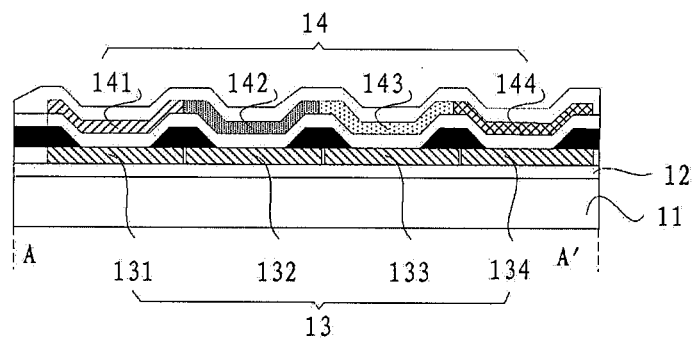
FIG. 2 is a schematic view of the pixel unit as shown in FIG. 1 in A-A' direction.

Specifically, as shown in FIG. 1 and FIG. 2, take the example that the pixel unit comprises four sub-pixels, the four sub-pixels display four colors of red (R), green (G), Blue (B), and yellow (Y) respectively. As shown in FIG. 2, the OLED array substrate comprises: a glass substrate 1 and a TFT array 12 and a pixel electrode 13 formed on the glass substrate 11. An red organic luminescent material layer 141 covers a first pixel electrode 131 so as to form a red sub-pixel, a yellow organic luminescent material layer 142 covers a second pixel electrode 132 so as to form a yellow sub-pixel, a green organic luminescent material layer 143 covers a third pixel electrode 133 so as to form a green sub-pixel, a blue organic luminescent material layer 144 covers a first pixel electrode 134 so as to form a blue sub-pixel. That is, in the prior art, the organic luminescent material layer of one color covers one pixel electrode in the pixel unit, so as to form one sub-pixel. However, since the evaporating accuracy of the organic luminescent material layer is low when the organic luminescent material layer is formed using the FMM evaporating, such that the area of one sub-pixel is relatively large, the resolution of the display panel is relatively low.

Figure 3:
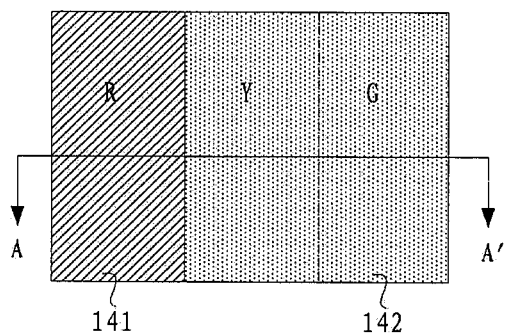
FIG. 3 is a schematic view of a pixel unit provided by the embodiment of the present disclosure.
Figure 4:
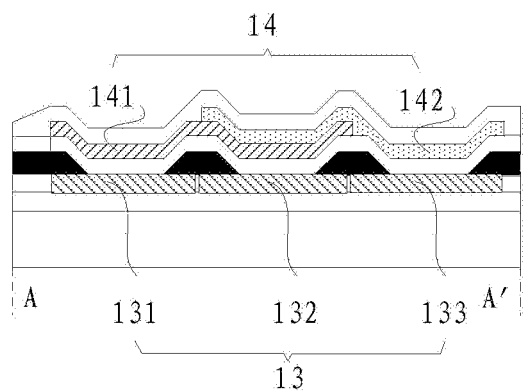
FIG. 4 is a schematic view of the pixel unit as shown in FIG. 3 in A-A' direction.

The embodiment of the present disclosure provides an OLED array substrate, comprising a plurality of pixel units, the pixel unit at least comprising a first sub-pixel, a second sub-pixel and a third sub-pixel, as shown in FIG. 3 and FIG. 4, comprising: a substrate 11, a TFT array 12 and a pixel electrode 13 formed on the substrate 11, at least two organic luminescent material layers 14 that display different colors formed on the pixel electrode 13, wherein a first sub-pixel (red R sub-pixel) comprises a first pixel electrode 131, a second sub-pixel (yellow Y sub-pixel) comprises a second pixel electrode 132, a third sub-pixel (green G sub-pixel) comprises a third pixel electrode 133, an organic luminescent material layer of a first color (red organic luminescent material layer 141) covers the adjacent first pixel electrode 131 and second pixel electrode 132 in the pixel unit 10, an organic luminescent material layer of a second color (green organic luminescent material layer 142) covers the adjacent second pixel electrode 132 and third pixel electrode 133 in the pixel unit 10.

FIG. 1 and FIG. 3 take the example that the organic luminescent material layer of the first color is the red organic luminescent material layer 141 and the organic luminescent material layer of the second color is the green organic luminescent material layer 142, then the third pixel electrode 133 is covered with the red organic luminescent material layer 141 and the green organic luminescent material layer 142 simultaneously, the third sub-pixel can display a mixed color of red and green, i.e., it may be yellow. Moreover, referring to FIG. 3, although the pixel unit 10 can display three different colors of red (R), green (G) and yellow (Y), with reference to FIG. 4, the organic luminescent material layer 14 only comprises the red organic luminescent material layer 141 and the green organic luminescent material layer 142, the red organic luminescent material layer 141 and the green organic luminescent material layer 142 cover two adjacent pixel electrodes respectively, i.e., in the case that the evaporating accuracy of the organic luminescent material layer is same as the prior art, the evaporating areas of the red organic luminescent material layer and the green organic luminescent material layer is substantially equal to the areas of two pixel electrodes. Whereas the organic luminescent material layer in the prior art is generally formed by way of FMM evaporating, hence, the evaporating accuracy of the organic luminescent material layer is not high, such that the area of one sub-pixel is relatively large, the resolution of the display panel is relatively low. While the pixel electrode is formed using mask plate exposure, hence, the evaporating accuracy of the pixel electrode is high. The present disclosure enables the organic luminescent material layer of one color to cover two pixel electrodes correspondingly exactly in the case that the evaporating accuracy of the organic luminescent material layer is invariable, hence, a display panel of a high resolution can be fabricated by reducing the area of the pixel electrode, i.e., reducing the area of one sub-pixel.

In the embodiment of the present disclosure, the pixel unit at least comprises a first sub-pixel, a second sub-pixel and a third sub-pixel, the first sub-pixel comprises a first electrode, the second sub-pixel comprises a second electrode, the third sub-pixel comprises a third electrode, an organic luminescent material layer of a first color covers the adjacent first pixel electrode and second pixel electrode in the pixel unit, an organic luminescent material layer of a second color covers the adjacent second pixel electrode and third pixel electrode in the pixel unit. That is, the first pixel electrode is only covered with the organic luminescent material layer of the first color, the third pixel electrode is only covered with the organic luminescent material layer of the second color, while the second pixel electrode is covered with the organic luminescent material layer of the first color and the organic luminescent material layer of the second color. Thus, the color displayed by the second sub-pixel is a mixed color of the first color and the second color. For example, if the first color is red, the second color is green, the color displayed by the second sub-pixel will be a superposed color of red and green, i.e., it may be yellow.

Since the organic luminescent material layer of the first color and the organic luminescent material layer of the second color both cover two adjacent pixel electrodes, when the organic luminescent material layer of the first color and the organic luminescent material layer of the second color are deposited through the FMM evaporating process, the organic luminescent material layers cover two pixel electrodes correspondingly, the area of the hollowed area on the mask plate is relatively large, hence, a display panel of a high resolution can be fabricated by reducing the area of the pixel electrode, i.e., reducing the area of a sub-pixel.

Optionally, the array substrate comprises three organic luminescent material layers that display different colors formed on the pixel electrode, wherein the pixel unit further comprises a fourth sub-pixel, the fourth sub-pixel comprises a fourth pixel electrode, an organic luminescent material layer of a third color covers the fourth pixel electrode, or, the organic luminescent material layer of the third color covers the adjacent third pixel electrode and fourth pixel electrode in the pixel unit. The organic luminescent material layers of three different colors are formed on the pixel electrode, and the pixel unit comprises a fourth pixel electrode, thus the display device can at least display four different colors, which enables the display effect of the display device to be richer.

Figure 5:
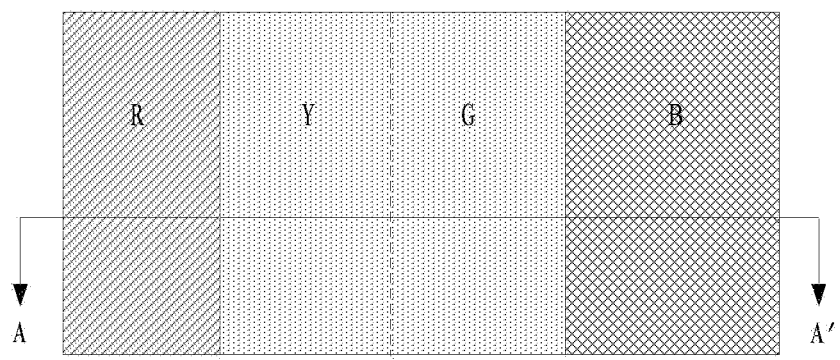
FIG. 5 is a schematic view of another pixel unit provided by the embodiment of the present disclosure.
Figure 6:
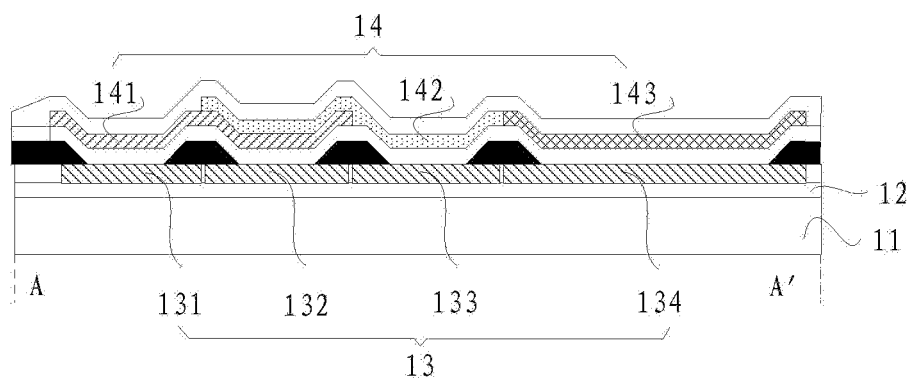
FIG. 6 is a schematic view of the pixel unit as shown in FIG. 5 in A-A' direction.
Figure 7:
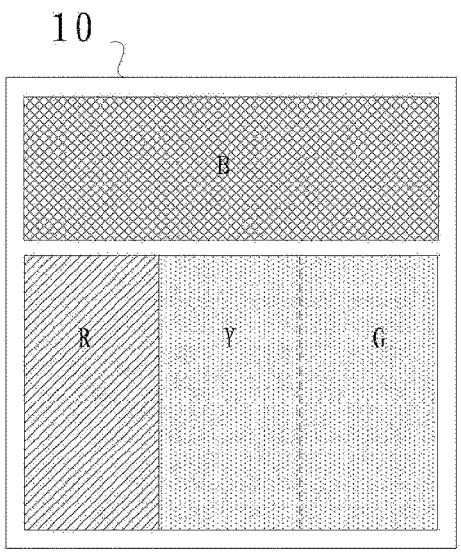
FIG. 7 is a schematic view of another pixel unit provided by the embodiment of the present disclosure.

Specifically, take the example that the third organic luminescent material layer covers the fourth pixel electrode. As shown in FIG. 5 and FIG. 6, the array substrate comprises organic luminescent material layers that display three colors of red, green, and blue formed on the pixel electrode 13, wherein the pixel unit 10 further comprises a blue sub-pixel, the blue sub-pixel comprising a fourth pixel electrode 134, the red organic luminescent material layer covers the adjacent first pixel electrode 131 and second pixel electrode 132 in the pixel unit 10, the green organic luminescent material layer covers the adjacent second pixel electrode 132 and the third pixel electrode 133 in the pixel unit 10, the blue organic luminescent material layer covers the fourth pixel electrode 134 in the pixel unit 10.

As shown in FIG. 5 and FIG. 6, the red organic luminescent material layer 141 covers the adjacent first pixel electrode 131 and second pixel electrode 132 in the pixel unit 10, i.e., the red organic luminescent material layer 141 is an organic luminescent material layer of a first color; the green organic luminescent material layer 142 covers the adjacent second pixel electrode 132 and the third pixel electrode 133 in the pixel unit 10, i.e., the green organic luminescent material layer 142 is an organic luminescent material layer of a second color. The blue organic luminescent material layer 143 is an organic luminescent material layer of a third color.

The red organic luminescent material layer 141 covers the adjacent first pixel electrode 131 and second pixel electrode 132 in the pixel unit 10, the green organic luminescent material layer 142 covers the adjacent second pixel electrode 132 and third pixel electrode 133 in the pixel unit 10, the blue organic luminescent material layer covers the fourth pixel electrode 134 in the pixel unit 10. That is, the first pixel electrode 131 is only covered with the red organic luminescent material layer 141, the first sub-pixel is a red sub-pixel; the third pixel electrode 133 is only covered with the green organic luminescent material layer 142, the third sub-pixel is a green sub-pixel; the fourth pixel electrode 134 is only covered with the blue organic luminescent material layer 143, the fourth sub-pixel is a blue sub-pixel; whereas the second pixel electrode 132 is covered with the red organic luminescent material layer 141 and the green organic luminescent material layer 142, thus the color displayed by the second sub-pixel is a superposed color of red and green, i.e., it may be yellow. Here, although the array substrate only comprises organic luminescent layers of three colors of red, green, and blue, as shown in FIG. 5, the pixel unit 10 may display fourth colors of red (R), green (G), blue (B), and yellow (Y), which can realize full color display, the display effect of the display device is richer.

Indeed, the organic luminescent material layers of the above three colors can also be any of other colors, then after being mixed, the pixel unit can display other colors. The embodiment of the present disclosure only makes explanations by taking the above three colors as the example.

For example, the organic luminescent material layer of the first color may be a yellow organic luminescent material layer, the organic luminescent material layer of the second color may be a blue organic luminescent material layer, the color displayed by the second sub-pixel is a mixed color of yellow and blue, i.e., it may be green. Here, the organic luminescent material layer of the fourth color may be red, thus the array substrate comprises organic luminescent material layers of three colors of red, yellow, and blue, whereas the display unit can display four colors of red, green, yellow, and blue, i.e. it can realize full color display.

If the organic luminescent material layer of the third color covers the adjacent third pixel electrode and fourth pixel electrode in the pixel unit, the third pixel electrode may be covered with the organic luminescent material layer of the second color and the organic luminescent material layer of the third color simultaneously, thus the color displayed by the third sub-pixel is a superposed color of the second color and the third color. The display device can display five different colors through the organic luminescent material layers of three colors, and the display effect of the display device will be richer.

Preferably, as shown in FIG. 5 and FIG. 6, in the pixel unit 10, the area of the fourth pixel electrode 134 is larger than the area of any of the other pixel electrodes. Since the attenuation rate of the blue organic luminescent material layer is greater than the red and green organic luminescent material layer, increase of the area of the blue organic luminescent material layer can make the attenuation of the three colors of red, green and blue in the pixel unit consistent, so as to avoid color distortion.

It should be noted that the present disclosure does not define the arrangement manner of the respective sub-pixels in the pixel unit specifically. For example, the pixel unit may also be as shown in FIG. 6, take the example that the pixel unit comprises four sub-pixels, the four sub-pixels display four colors of red (R), green (G), blue (B), and yellow (Y) respectively, wherein the blue sub-pixel is located in a different line from the sub-pixels of other colors. Wherein the yellow sub-pixel in FIG. 6 whose pixel electrode may be covered by the red organic luminescent material layer and the green organic luminescent material layer simultaneously.

Optionally, the pixel electrode is an anode or a cathode.

Moreover, in the case that the pixel electrode is an anode, the array substrate further comprises: a cathode formed over the organic luminescent material layer. A hole injection function layer and a hole transport function layer formed between the pixel electrode and the organic luminescent material layer, wherein the hole injection function layer is close to the pixel electrode, and the hole transport function layer is close to the organic luminescent material layer. And, an electron injection function layer and an electron transport function layer formed over the organic luminescent material layer, wherein the electron transport function layer is close to the organic luminescent material layer, and the electron injection function layer is close to the cathode.

Or, optionally, in the case that the pixel electrode is a cathode, the array substrate further comprises: an anode formed over the organic luminescent material layer. An electron injection function layer and an electron transport function layer formed between the pixel electrode and the organic luminescent material layer, wherein the electron injection function layer is close to the pixel electrode, and the electron transport function layer is close to the organic luminescent material layer. And, a hole injection function layer and a hole transport function layer formed over the organic luminescent material layer, wherein the hole transport function layer is close to the organic luminescent material layer, and the hole injection function layer is close to the anode.

The electron injection function layer and the electron transport function layer are benefit for transport of electrons, the hole injection function layer and the hole transport function layer are benefit for transport of holes, so as to improve luminous efficiency of the organic luminescent material layer.

The embodiment of the present disclosure provides a display device comprising an OLED array substrate provided by any of the embodiments of the present disclosure.

Figure 8:
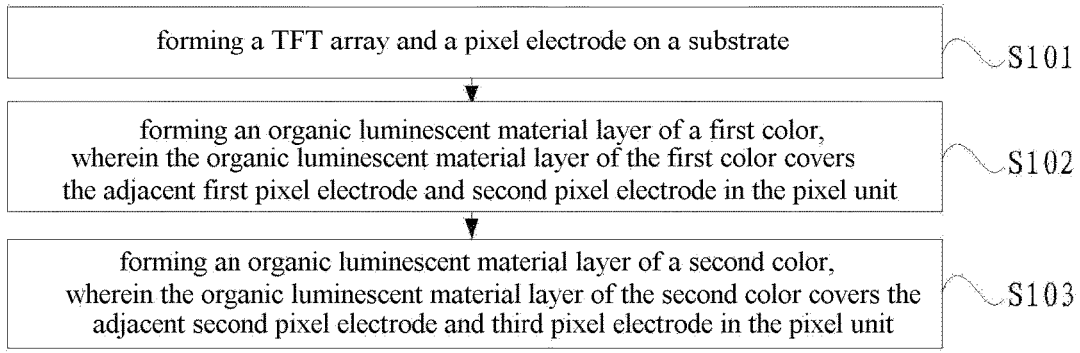
FIG. 8 is a schematic view of an OLED array substrate fabricating method provided by the embodiment of the present disclosure.

The embodiment of the present disclosure provides a fabricating method of an OLED array substrate, the array substrate comprising a plurality of pixel units, the pixel unit at least comprising a first sub-pixel, a second sub-pixel and a third sub-pixel, as shown in FIG. 8, the fabricating method comprises:

Step 101, forming a TFT array and a pixel electrode on a substrate.

Wherein the pixel unit at least comprises a first sub-pixel, a second sub-pixel and a third sub-pixel, the first sub-pixel comprises a first pixel electrode, a second sub-pixel comprises a second pixel electrode and the third sub-pixel comprises a third pixel electrode.

Step 102, forming an organic luminescent material layer of a first color, wherein the organic luminescent material layer of the first color covers the adjacent first pixel electrode and second pixel electrode.

Step 103, forming an organic luminescent material layer of a second color, wherein the organic luminescent material layer of the second color covers the adjacent second pixel electrode and third pixel electrode in the pixel unit.

Figure 9:
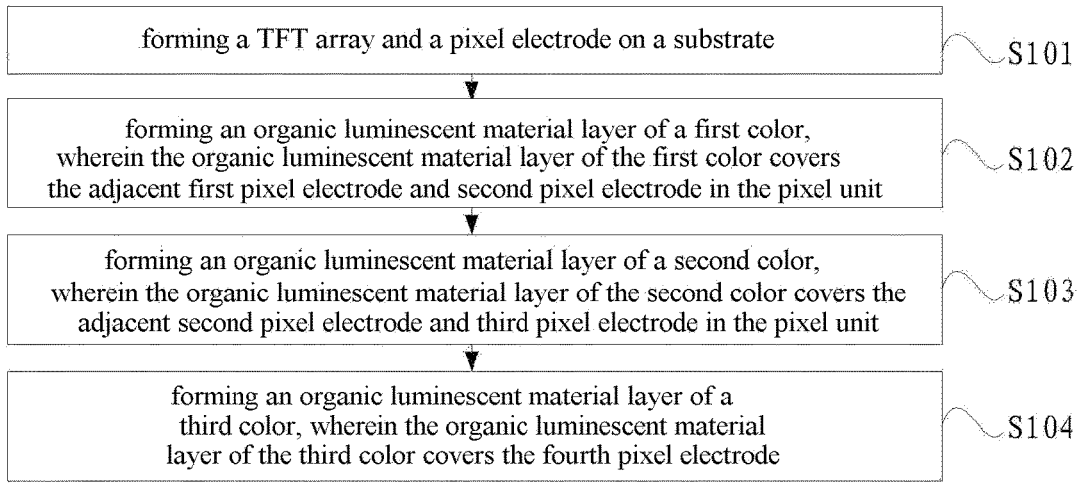
FIG. 9 is a schematic view of another OLED array substrate fabricating method provided by the embodiment of the present disclosure.

Optionally, the pixel unit further comprises a fourth sub-pixel, the fourth sub-pixel comprises a fourth pixel electrode; as shown in FIG. 9, and the fabricating method further comprises:

Step 104, forming an organic luminescent material layer of a third color, wherein the organic luminescent material layer of the third color covers the fourth pixel electrode.

Optionally, the above step 102 is specifically: forming a red organic luminescent material layer; the above step 103 is specifically: forming a green organic luminescent material layer; the above step 104 is specifically: forming a blue organic luminescent material layer, thus the formed pixel unit may be as shown in FIG. 5 and FIG. 6.

It should be noted that the order of the above steps 102-104 is not defined specifically in the embodiment of the present disclosure, the embodiments and the drawings of the present disclosure only take one of them as the example for explanation. Moreover, the OLED array substrate further comprises other thin film or layer structures, the embodiment of the present disclosure only lists the fabricating method of thin film or layer structures related to the inventive point of the present disclosure, other thin film or layer structures may make reference to the existing fabricating method, which will not be repeated in the embodiment of the present disclosure.

Further, in the case that the pixel electrode is an anode, before evaporating the organic luminescent material layer that covers the pixel electrode in the pixel unit using a mask plate, the method further comprises: forming a hole injection function layer and a hole transport function layer on the pixel electrode successively, and forming an electron transport function layer and an electron injection function layer on the organic luminescent material layer successively, and then forming a cathode on the organic luminescent material layer.

Or, in the case that the pixel electrode is a cathode, before evaporating the organic luminescent material layer that covers the pixel electrode in the pixel unit using a mask plate, the method further comprises: forming an electron injection function layer and an electron transport function layer on the pixel electrode successively, and forming a hole injection function layer and a hole transport function layer on the organic luminescent material layer successively, finally, forming an anode on the organic luminescent material layer.

What are stated above are only specific implementing modes of the present disclosure, however, the protection scope of the present disclosure is not limited to this. Any modifications or replacements that can be easily conceived by the skilled person familiar with the present technical field within the technical scope disclosed by the present disclosure should be covered within the protection scope of the present disclosure. Therefore, the protection scope of the present disclosure should depend on the protection scopes of the claims.

The invention claimed is:

1. An organic light emitting diode array substrate, comprising a plurality of pixel units, the pixel unit at least comprising a first sub-pixel, a second sub-pixel and a third sub-pixel, wherein the array substrate further comprises: a substrate, a pixel electrode formed on the substrate, at least two organic luminescent material layers that display different colors formed on the pixel electrode, wherein the first sub-pixel comprises a first pixel electrode, the second sub-pixel comprises a second pixel electrode, the third sub-pixel comprises a third pixel electrode, an organic luminescent material layer of a first color covers the adjacent first pixel electrode and second pixel electrode in the pixel unit, an organic luminescent material layer of a second color covers the adjacent second pixel electrode and third pixel electrode in the pixel unit, wherein the array substrate comprises three organic luminescent material layers that display different colors formed on the pixel electrode, wherein the pixel unit further comprises a fourth sub-pixel, the fourth sub-pixel comprises a fourth pixel electrode, an organic luminescent material layer of a third color covers the fourth pixel electrode, or, the organic luminescent material layer of the third color covers the adjacent third pixel electrode and fourth pixel electrode in the pixel unit.

2. The array substrate according to claim 1, wherein in the case that the organic luminescent material layer of the third color covers the fourth pixel electrode, the organic luminescent material layer of the first color is a red organic luminescent material layer, the organic luminescent material layer of the second color is a green organic luminescent material layer, the organic luminescent material layer of the third color is a blue organic luminescent material layer.

3. The array substrate according to claim 2, wherein the area of the fourth pixel electrode is larger than the area of any of the other pixel electrodes.

4. A display device, comprising an organic light emitting diode array substrate as claimed in claim 3.

5. A display device, comprising an organic light emitting diode array substrate as claimed in claim 2.

6. The array substrate according to claim 1, wherein the pixel electrode is an anode or a cathode.

7. A display device, comprising an organic light emitting diode array substrate as claimed in claim 6.

8. A display device, comprising an organic light emitting diode array substrate as claimed in claim 1.

9. A fabricating method of an organic light emitting diode array substrate, the array substrate comprising a plurality of pixel units, the pixel unit at least comprising a first sub-pixel, a second sub-pixel and a third sub-pixel, wherein the fabricating method comprises:

forming a pixel electrode on a substrate, wherein the first sub-pixel comprises a first pixel electrode, the second sub-pixel comprises a second pixel electrode and the third sub-pixel comprises a third pixel electrode;

forming an organic luminescent material layer of a first color, wherein the organic luminescent material layer of the first color covers the adjacent first pixel electrode and second pixel electrode;

forming an organic luminescent material layer of a second color, wherein the organic luminescent material layer of the second color covers the adjacent second pixel electrode and third pixel electrode, wherein the pixel unit further comprises a fourth sub-pixel, the fourth sub-pixel comprises a fourth pixel electrode; the method further comprises:

forming an organic luminescent material layer of a third color, wherein the organic luminescent material layer of the third color covers the fourth pixel electrode.

10. The fabricating method according to claim 9, wherein, forming the organic luminescent material layer of the first color specifically comprises:

forming a red organic luminescent material layer;

forming the organic luminescent material layer of the second color specifically comprises: forming a green organic luminescent material layer;

forming the organic luminescent material layer of the third color specifically comprises:

forming a blue organic luminescent material layer.

11. The fabricating method according to claim 10, wherein the area of the fourth pixel electrode is larger than the area of any of the other pixel electrodes.

12. A display device, comprising an organic light emitting diode array substrate fabricated by a fabricating method of an organic light emitting diode array substrate as claimed in claim 11.

13. A display device, comprising an organic light emitting diode array substrate fabricated by a fabricating method of an organic light emitting diode array substrate as claimed in claim 10.

14. A display device, comprising an organic light emitting diode array substrate fabricated by a fabricating method of an organic light emitting diode array substrate as claimed in claim 9.

* * * * *